United States Patent [19]

Ogawa et al.

[11] Patent Number: 5,681,442
[45] Date of Patent: Oct. 28, 1997

[54] METHOD OF PRODUCING AN ORGANIC DEVICE

[75] Inventors: Kazufumi Ogawa, Hirakata; Norihisa Mino, Settsu, both of Japan

[73] Assignee: Matsushita Electric Industrial Co., Ltd., Osaka, Japan

[21] Appl. No.: 565,636

[22] Filed: Nov. 29, 1995

Related U.S. Application Data

[63] Continuation of Ser. No. 265,851, Jun. 27, 1994, abandoned, which is a continuation of Ser. No. 25,122, Mar. 1, 1993, abandoned, which is a division of Ser. No. 678,436, Apr. 1, 1991, Pat. No. 5,223,331.

[30] Foreign Application Priority Data

Jul. 31, 1990 [JP] Japan ..................... 2-203281

[51] Int. Cl.$^6$ ..................................... C25D 9/02
[52] U.S. Cl. .................. 205/122; 205/183; 205/167; 205/219
[58] Field of Search ..................... 205/122, 183, 205/219, 164

[56] References Cited

U.S. PATENT DOCUMENTS

| | | | |
|---|---|---|---|
| 4,715,929 | 12/1987 | Ogawa | 357/8 |
| 4,835,083 | 5/1989 | Sakai et al. | 156/643 |
| 5,017,975 | 5/1991 | Ogawa | 357/8 |

FOREIGN PATENT DOCUMENTS

| | | |
|---|---|---|
| 0298628 | 1/1989 | European Pat. Off. . |
| 0351092 | 1/1990 | European Pat. Off. . |

OTHER PUBLICATIONS

J. Paloheimo, et al, "Molecular Field–Effect Transistors Using Conducting Polymer Langmuir–Blodgett Films", Applied Phys. Lett., vol. 56, No. 12, Mar. 19, 1990, pp. 1157–1159.

H. Tomozawa, et al, "Metal–Polymer Schottky Barriers on Cast Films of Soluble Poly(3–Alkylthiophenes), Synthetic Metals", 22, pp. 63–69, 1987 no month available.

Applied Physics Letters, vol. 53, No. 3, pp. 195–197 Jul. 18, 1988, NY, New York, USA, A. Assadi et al "Field–effect mobility of poly (3–hexylthiophene)".

Patent Abstracts of Japan, vol. 10, No. 367 (E–462) (2424), Dec. 9, 1986, & JP–A–61163658—whole document.

Patent Abstracts of Japan, vol. 10, No. 203 (C–360) (2259) Jul. 16, 1986, & JP–A–6144921.

*Primary Examiner*—Kathryn L. Gorgos

[57] ABSTRACT

A process for producing an organic device includes forming a first electrode and a second electrode on a substrate having an insulating film formed on a surface thereof, etching out the insulating film with the first electrode and the second electrode being used as masks, forming a monomolecular or built-up monomolecular film containing electrolytically polymerizable unsaturated groups directly or indirectly on the surface of the substrate by a chemical absorption method or the Langmuir-Blodgett method. The process further includes a procedure of spreading a surfactant containing the electrolytically polymerizable unsaturated groups on the surface of a water bath to form a monomolecular film, transferring at least one layer of the monomolecular film into the surface of the substrate, and chemically bonding molecules of the surfactant to form at least one layer of the monomolecular film of the surfactant containing electroconductive conjugated groups, applying a voltage between the first electrode and the second electrode to polymerize the electrolytically polymerizable unsaturated groups, and deriving a third electrode from the substrate such that the substrate acts as the third electrode.

4 Claims, 5 Drawing Sheets

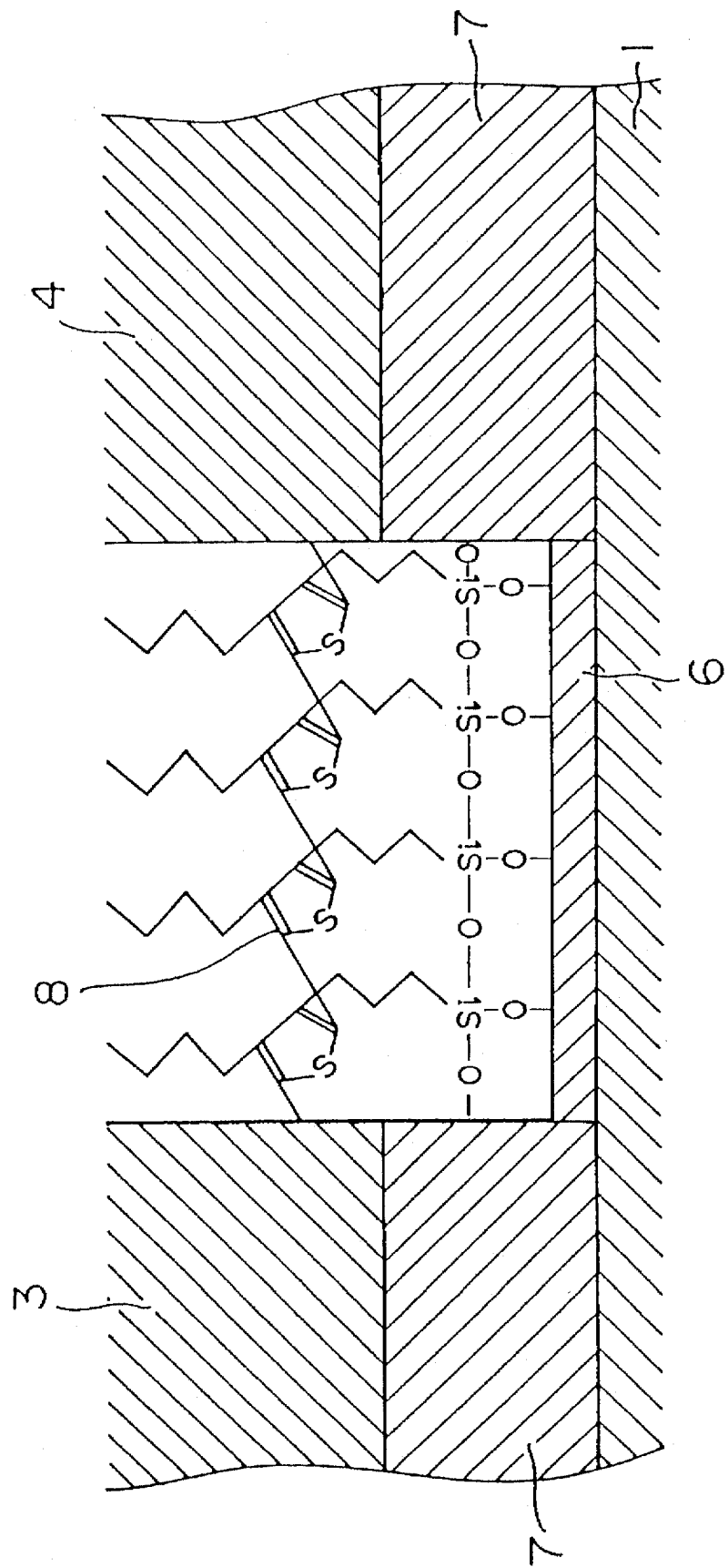

METHOD OF PRODUCING AN ORGANIC DEVICE

This application is a continuation of application Ser. No. 08/265,851, filed Jun. 27, 1994 (abandoned), which is a continuation of application Ser. No. 08/025,122, filed Mar. 1, 1993 (abandoned), which is a divisional of application Ser. No. 07/678,436, filed Apr. 1, 1991 which issued as U.S. Pat. No. 5,223,331 on Jun. 29, 1993.

BACKGROUND OF THE INVENTION

1. Field of the Invention

The present invention relates to an electronic device with organic materials (organic device) and a method for producing the same. More particularly, the present invention relate to an electronic device utilizing a current of electrons flowing through an electroconductive monomolecular film or an electroconductive built-up multi-monomolecular film and a method for producing the same.

2. Description of Related Art

Electronic devices have been heretofore manufactured by using inorganic semiconductor crystals such as silicon crystals. However, the inorganic crystals have disadvantage that as they are made finer, lattice defects become critical and the performance of the devices depends greatly upon the crystallinity.

SUMMARY OF THE INVENTION

It is an object of the present invention to provide an electronic device of a high packing density having learning functions produced by using organic materials which are independent of the crystallinity even when the fine processing is performed to increase the packing density of the devices.

In order to overcome the problems as stated above, the present invention provides an organic device comprising a substrate having a polymerized monomolecular or built-up multi-monomolecular film, a first electrode, a second electrode with said film intervening between said electrodes, a third electrode connected directly or indirectly to said monomolecular or built-up multi-monomolecular film, which device is operated by applying a voltage between said third electrode and said second electrode to control an electric current flowing across said first electrode and said second electrode through said polymerized monomolecular or built-up multi-monomolecular film between said electrodes. If the polymerization of the monomolecular film is eliminated, the resistant device can be imparted with learning functions because the polymerization of the film proceeds depending upon an amount of electricity flowing during the use of the device.

Since the present invention makes use of electroconductive groups in the monomolecular or built-up multi-monomolecular film, there can be produced devices with organic materials that are independent of crystallinity even when fine processing is performed for further increasing the high packing density of the devices.

BRIEF DESCRIPTION OF THE DRAWINGS

FIG. 1B is an enlarged schematic cross-sectional view on the order of molecule of the circled part A of the embodiment shown in FIG. 1A.

DETAILED DESCRIPTION OF PREFERRED EMBODIMENTS

Figure 1A:
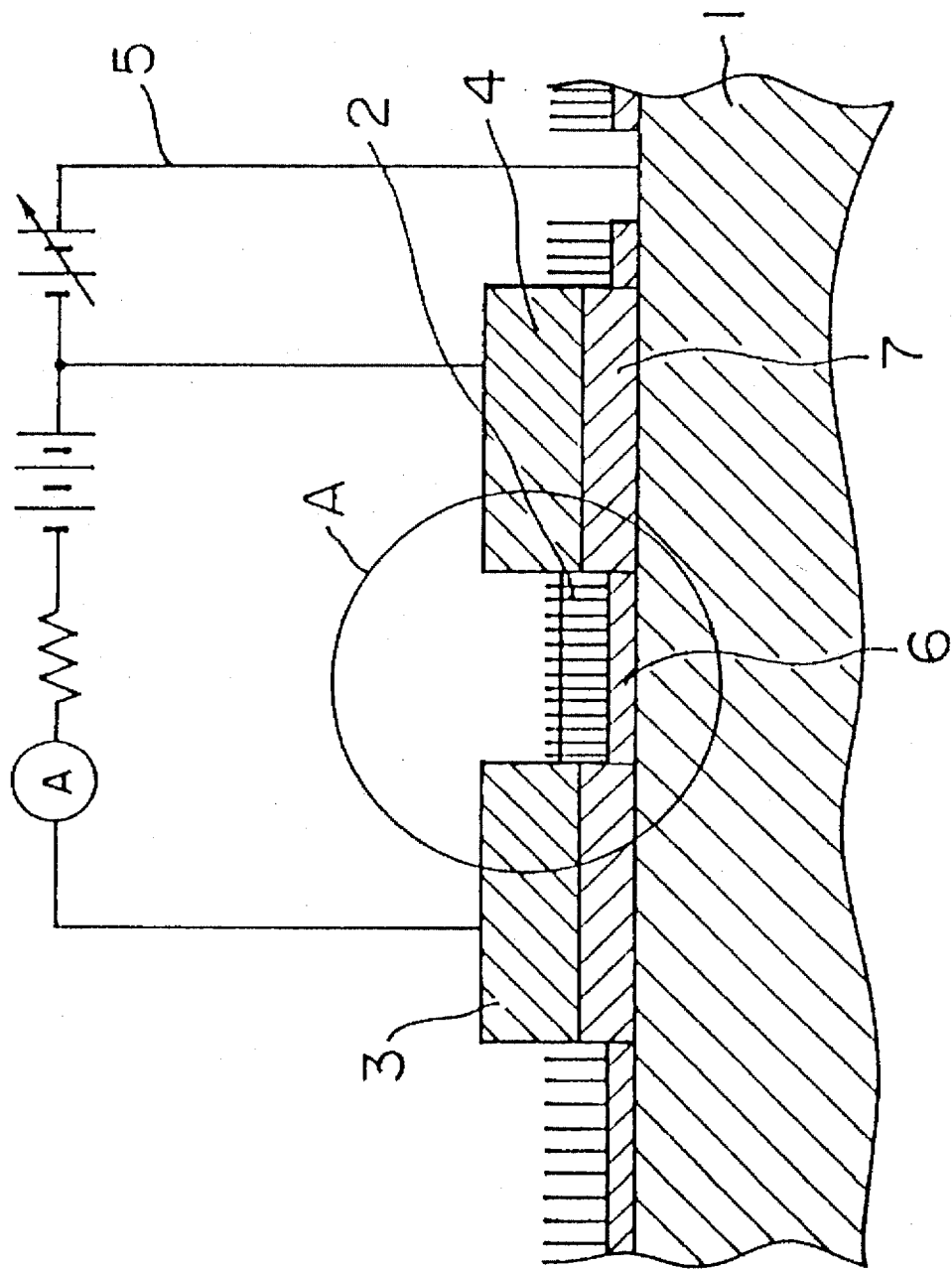
FIG. 1A is a schematic cross-sectional view of an embodiment of the organic devices according to the present invention.

The present invention provides an organic device comprising a substrate having a first electrode and a second electrode formed with an electrolytically polymerized monomolecular or built-up multi-monomolecular layer intervening between said electrodes, and a third electrode connected directly or indirectly to said monomolecular or built-up multi-monomolecular layer as well as to said first and second electrodes, which device is operated by applying a voltage between said third electrode and said second electrode to control an electric current flowing between said first electrode and said second electrode depending upon variation of said voltage.

The area across which the electric current flows is formed with conjugated bonds produced within an organic material, especially an organic monomolecular or built-up multi-monomolecular film by an electrolytic polymerization thereof, thereby achieving an enhancement in high functionality and a finer structure of the device.

As a technique for forming the organic monomolecular or built-up multi-monomolecular film, the use of linear hydrocarbon derivatives having a

group at a terminal enables the monomolecular film to be formed on a hydrophilic surface of a substrate by chemical adsorption in an organic solvent (a chemical adsorption method), and the built-up multi-monomolecular film can also be formed by making the surface of the previously formed monomolecular film have reactive functional groups such as vinyl group, subjecting the surface to high energy irradiation in a gaseous atmosphere containing oxygen or nitrogen to render the surface hydrophilic, and repeating the chemical adsorption process as above.

Thus, the chemical adsorption method using materials such as linear hydrocarbons containing an unsaturated group capable of being electrolytically polymerized (e.g., thienylene group) in a part of the molecule can be conducted to produce a monomolecular film having electrolytically polymerizable groups oriented on the order of several tens Angstroms as well as a built-up multi-monomolecular film with ease.

The electrolytically polymerizable unsaturated groups such as thiophene groups of the monomolecular film built up by said method may be field-polymerized under an electric field applied between the first electrode and the second electrode allowing the polythienylene groups to undergo self-arranging growth in the direction of the field in an electroytic solution, thereby forming a monomolecular or built-up multi-monomolecular film having an ultra-high molecular weight with a very long conjugated segment, which film is stable in an atmosphere containing oxygen and comprises a sequence of electroconductive conjugated bonding groups connecting the first electrode and the second electrode. If the electrolytic polymerization is eliminated in the formation of the film, the resultant device may be used as a device having learning functions acting depending upon a length of switching on-time since the electrolytically polymerizable unsaturated groups of the film will be polymerized in use depending upon an amount of a flow of electric current.

Alternatively, a material having electrolytically polymerizable unsaturated groups dissolved in an organic solvent is spread on the surface of a water bath, and after the organic solvent is evaporated, the molecules of the material remaining on the surface of the water are collected by a barrier in the direction parallel to the surface of the water to build up a monomolecular or multi-monomolecular film on a substrate while the substrate is moved up and down under a predetermined pressure applied to the surface of the water (this process for building up is called as the "Langmuir-Blodgett" (LB) method and the monomolecular layer built up by this method is referred to as LB film), and thereafter, the produced layer is similarly field-polymerized to form a polymeric monomolecular or built-up multi-monomolecular film of a conjugated bonding type which has an ultra-high molecular weight, a very elongated conjugated segment, and a high stability even in an atmosphere containing oxygen, with electroconductive conjugated groups connecting the first electrode and the second electrode.

EXAMPLES

Details of the devices and the process for producing the same according to the present invention will be described with reference to Examples as well as to FIGS. 1 to 4 hereinunder.

For example, as shown in FIGS. 1A and 1B, there is produced a substrate 1 having an electrolytically polymerized electroconductive monomolecular or built-up multi-monomolecular film 2 formed between a first metallic electrode 3 and a second metallic electrode 4 on insulating films and a third metallic electrode 5 (gate electrode) formed on the surface of the substrate.

Since the electroconductive monomolecular or built-up multi-monomolecular films are very thin on the order of tens of Angstroms, an amount of holes or electrons to be injected into the electroconductive conjugated group segment of the electroconductive monomolecular or built-up multi-monomolecular film can be controlled by applying a voltage between the first electrode and the second electrode as well as between the first electrode or the second electrode and the third electrode, and by varying the voltage between the third electrode and the first electrode or the second electrode, so that one can produce a FET (Field Effect Transistor) type organic device where an electric current flowing through the electroconductive monomolecular or built-up multi-monomolecular film between the first electrode and the second electrode can be controlled.

FIG. 1B shows an enlarged schematic view of the part A of FIG. 1A. In the FIGURE, reference numbers 6 and 7 are insulating films (usually of $SiO_2$ when Si substrates are used).

For the production of the monomolecular or built-up multi-monomolecular films containing electrolytically polymerizable unsaturated groups, one may employ the chemical adsorption method or the LB method, as described later.

It is required here that the monomolecular or built-up multi-monomolecular films contain electroconductive conjugated groups such as polythienylene group for the electroconductive conjugated groups 8 (FIG. 1B), and that the connection between the first electrode and the second electrode is effected with the polythienylene groups.

For devices having enhanced amplifying properties, the insulating films 6 should be thinner, and may be eliminated.

In order to stabilize the electrical properties, the first and the second electrodes must be disposed in a manner such that the gap therebetween is uniform.

Moreover, the third electrode (that is, the substrate) should be made of easily oxidizable metals other than Au and Pt, or of semiconducting materials such as silicon to allow oxide films to form naturally on the surface of the electrode, which has an effect of increasing the breakage voltage between the first and the second metallic electrodes and the third metallic electrode. In addition, the formation of the oxide film is beneficial for the production of the chemically adsorbed films on the surface of the substrate which is used as the third electrode.

As electroconductive conjugated groups to be introduced, polyenes which are produced with electrolytically polymerizable unsaturated groups such as polypyrrole, polysilole, polypyridinopyridine, polyaniline and the like other than polythienylene can be used.

The device shown in FIGS. 1A and B may be naturally modified to provide a device having the identical functions by forming the first and the second metallic electrodes on the surface of the substrate and, thereafter, forming a third metallic electrode on the opposite side on the substrate with an electroconductive monomolecular or built-up multi-monomolecular film being interposed.

Procedures for producing the devices as above will now be described.

Figure 2A:
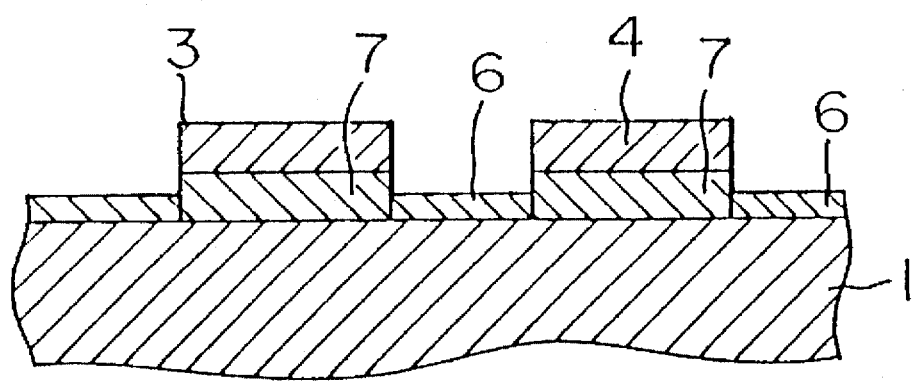
FIGS. 2A and B are schematic cross-sectional views illustrating a process for producing an embodiment of the organic devices according to the present invention.

First, patterns of first metallic electrode 3 and second metallic electrode 4 are formed on substrate 1 (e.g., Si substrate) with an insulating film 7 ($SiO_2$ film) intervening between the electrodes and the substrate by any suitable process as shown in FIG. 2A.

The metallic electrodes may be formed by utilizing any conventional process such as those where a metal film is deposited by vacuum evaporation onto the whole surface of the substrate and subjected to etching through a pattern of photoresist or to lift-off so as to leave a pattern of metallic electrodes.

Then, the insulating film 7 is etched out with the first electrode 3 and the second electrode 4 being used as masks. When Si substrates are employed as usual, very thin insulating films 6 consisting of a spontaneously formed oxide film ($SiO_2$) are formed on the surface simply by washing after etching without requiring any additional oxidation.

Then, the monomolecular or built-up multi-monomolecular films containing electrolytically polymerizable groups are formed on the insulating films 6.

The monomolecular films may be produced by utilizing the LB method or the chemical adsorption method.

Figure 2B:
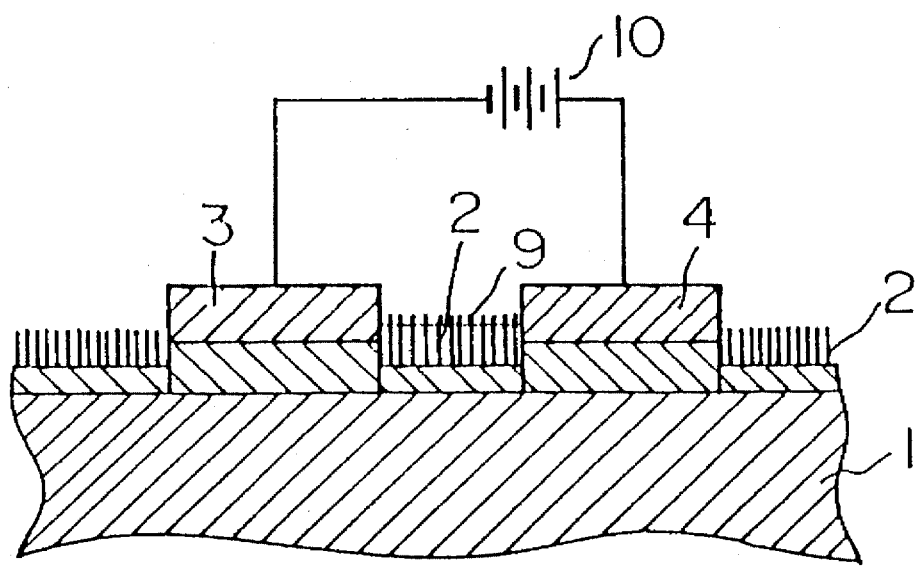

Furthermore, an electric field of about 5 V/cm is applied between the first electrode and the second electrode to polymerize for tens of minutes in nitrobenzene containing 0.02 mol/l of tetrabutyl ammonium perchlorate. At this time, the unsaturated groups are polymerized in sequence in the direction of the field, so that after perfect completion of the polymerization, the first electrode and the second electrode are connected self-arrangedly with conjugated bonds 9 (FIG. 2B). Alternatively, if the electrolytical polymerization is eliminated in the above procedure, the resulting device has naturally unsaturated groups in the film therein, the polymerization of which proceeds proportionally to the period of time of applying an electric current, i.e., an amount of the applied electric current, so that the conductivity between the first electrode and the second electrode is controlled (in other words, learning functions are imparted).

Finally, the third electrode (gate electrode) is derived from the substrate to complete the production of the device.

Process for Production of Monomolecular Film, Part 1 (Use of Chemical Adsorption Method)

Although a wide variety of chemicals have been used, the following explanation will be made to the use of one of thiophene derivatives, $CH_3$—$(CH_2)m$—R—$(CH_2)n$—$SiCl_2$ where R is a thiophene derivative group, and m+n is 17, though good results have been obtained in the range of 14 to 24 (referred to as TCS hereunder).

For example, as shown in FIG. 2A and B, Au electrodes are formed as the first electrode 3 and the second electrode 4 on a Si substrate 1 having insulating films ($SiO_2$ films) 7 formed on the surface thereof, and the exposed $SiO_2$ films are etched out.

Then, the monomolecular films are formed with TCS by chemical adsorption on the surface of the substrate. At this time, the

groups react with the —OH groups associated with the spontaneously formed oxide film ($SiO_2$ film) 11 to release hydrochloric acid resulting in the formation of a monomolecular

Figure 3A:
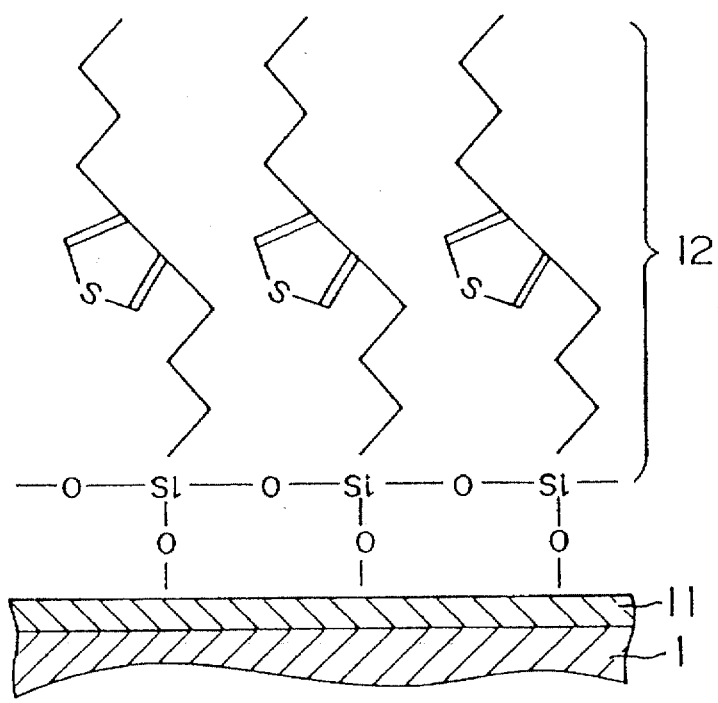
FIG. 3A is a an enlarged schematic cross-sectional view on the order of molecule of a single layer of TCS adsorbed film formed on a substrate.

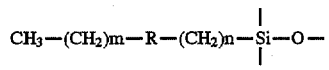

film 12 on the surface of the substrate (FIG. 3A).

For example, the substrate having the Au electrodes formed can be immersed in a solution of TCS (silane based surfactant) at a concentration of $2.0 \times 10^{-3}$ to $5.0 \times 10^{-3}$ mol/L dissolved in a solvent containing 80% n-hexadecane, 12% tetrachlorocarbon and 8% chloroform for tens of minutes at room temperature to produce

bondings on the surface of the $SiO_2$ film.

At this point, the formation of the monomolecular film 12 of

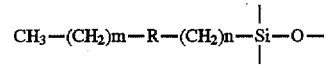

on the surface of the substrate has been confirmed by FTIR (Fourier Transform Infrared Spectrometer).

In this procedure, the formation of the film by chemical adsorption was performed in an atmosphere of $N_2$ containing no moisture.

Figure 3B:
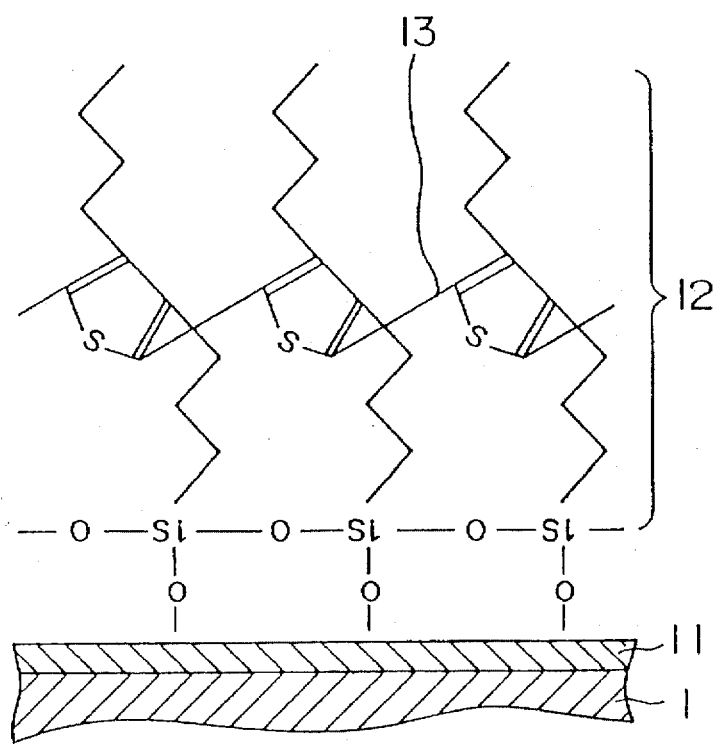
FIG. 3B is an enlarged schematic cross-sectional view on the order of molecule of polythienylene bonds formed on a substrate after polymerization.

Then, the polymerization is performed by applying an electric field of 5 V/cm between the electrodes 3 and 4 in the electrolytic solution as shown in FIG. 2B to cause such a reaction as shown in FIG. 3B, i.e., production of polythienylene bonds which has been clearly confirmed by FTIR.

Although there have been discussed in the aforementioned Examples the procedures where a single monomolecular film is formed by chemical adsorption and then polymerized, it is clearly possible that a plurality of adsorbed films may be built-up and thereafter subjected to a polymerization reaction, or that a cycle of the formation of an adsorbed film and the subsequent polymerization reaction may be repeated to produce the polythienylene multi-monomolecular film.

Process for Production of Monomolecular Film, Part 2 (Use of the LB Method)

Although a wide variety of chemicals have been used, the following explanation will be made to the use of one thienylene derivative, $CH_3$—$(CH_2)m$—R—$(CH_2)n$—COOH where R is a thiophene derivative group, and m+n is 17, though good results have been obtained in the range of 14 to 23 (referred to as TAD hereunder).

The LB films were built up in a clean room of a class 100 under yellow illumination with lights of 500 nm or less being cut off by using Joyce-Loebl Trough IV. At this time, the inside of the room was conditioned at room temperature of $23° \pm 1°$ C. and at a humidity of $40 \pm 5\%$. The substrates used in building up LB films were Si substrates of 3 inches in diameter having Ag electrodes formed thereon with oxide films intervening.

First, as shown in FIG. 2, Ag electrodes were formed as the first electrode 3 and the second electrode 4 on a Si substrate 1 having insulating films of $SiO_2$ 7 formed on the surface thereof, and the exposed $SiO_2$ films were etched out.

Figure 4A:
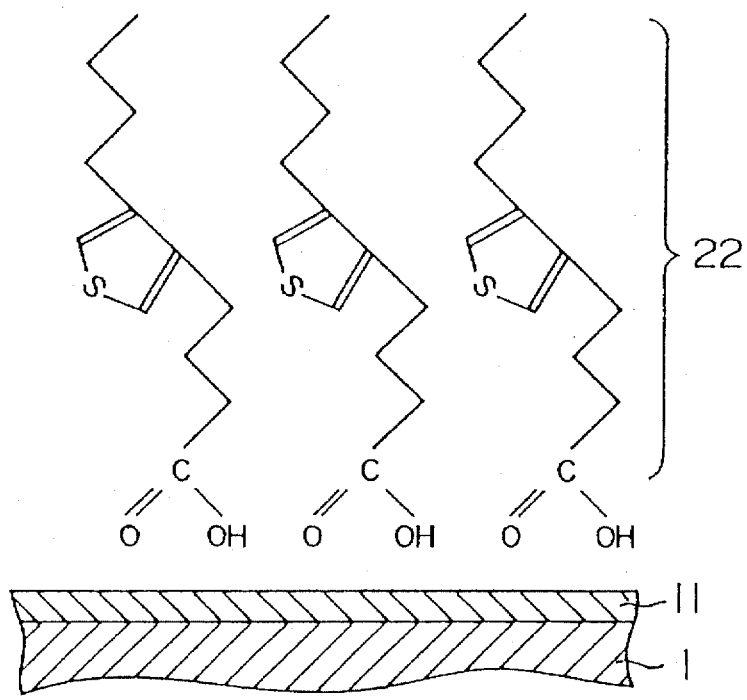
FIG. 4A is an enlarged schematic cross-sectional view on the order of molecule of a single layer of TADLB film formed on a substrate.

Then, the monomoleculer film 22 was formed with TAD by the LB method on the surface of the substrate. At this time, the —COOH groups were built-up onto the spontaneously formed oxide film ($SiO_2$ film) 11 on the Si substrate (FIG. 4A).

At this point, the formation of the monomolecular film 22 of $CH_3$—$(CH_2)m$—R—$(CH_2)n$—COOH on the surface of the substrate was confirmed by FTIR.

Figure 4B:
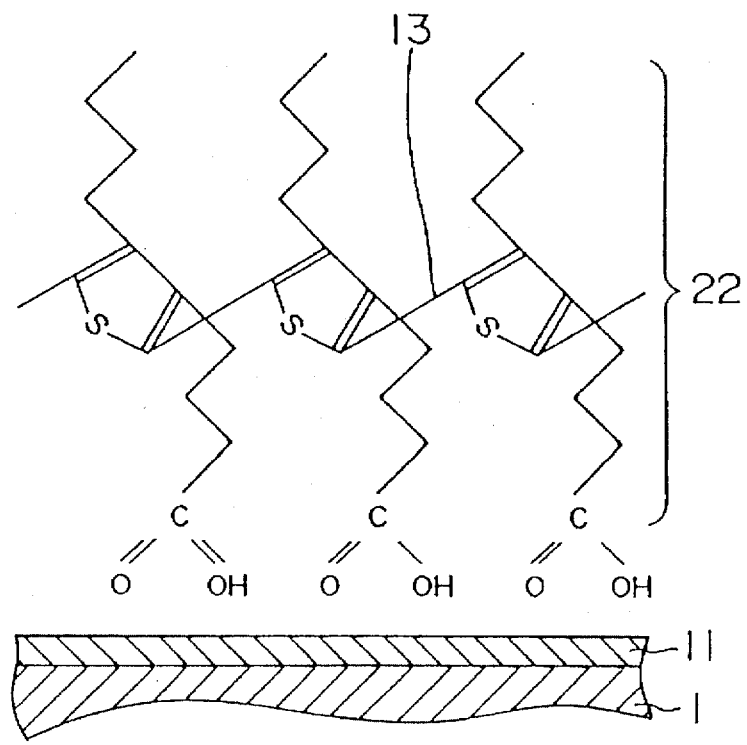
FIG. 4B is an enlarged schematic cross-sectional view on the order of molecule of polythienylene bonds formed on a substrate after polymerization.

Then, the polymerization is performed by applying an electric field of 5 V/cm across the electrodes 3 and 4 in the electrolytic solution as shown in FIG. 2B to cause such a reaction as shown in FIG. 4B, i.e., the production of polythienylene bonds 13 which has been clearly confirmed by FTIR.

Although the procedure where a single monomolecular film is formed and thereafter polymerized has been illustrated in this Example, it has been confirmed that it is possible to produce multi-monomolecular films of the polythienylene conjugated polymer by building up a plurality of LB films and thereafter conducting the electrolytical polymerization reaction, or by repeating alternatively the step of the formation of a film and the step of the polymerization reaction.

When the LB method is employed, the requisite number of steps is minimized by conducting the electrolytical polymerization after a plurality of films were built-up, since the building up can be easily carried out.

Other electroconductive conjugated groups which can be used other than the above illustrated ones are thienylene, pyrrole, pyridinopyridine, aniline, silole and the like.

The present invention provides an organic device comprising a substrate having a first electrode and a second electrode formed with a polymerized monomolecular or built-up multi-monomolecular film intervening between said electrodes, and a third electrode connected directly or indirectly to said monomolecular or built-up multi-monomolecular film, which device is operated by applying a voltage between said third electrode and said second electrode to control an electric current flowing between said first electrode and said second electrode. Therefore, by using the chemical adsorption method or the LB method together with the electrolytical polymerization, polymers having electroconductive conjugated bonds can be highly efficiently produced in a self-arranging manner so as connect between the two electrodes so that high performance organic devices can be achieved.

According to this process, it is possible theoretically to produce a linear electroconductive conjugated polymer having an ultra-high molecular weight and a sequence of conjugated bonds of several millimeters or several centimeters or more in length. Therefore, it is very useful for production of the present devices.

What is claimed is:

1. A process for producing an organic device comprising the steps of:

forming a first electrode and a second electrode on a substrate having an insulating film formed on a surface thereof, etching out said insulating film with said first electrode and said second electrode being used as masks, forming a monomolecular or built-up monomolecular film containing electrolytically polymerizable unsaturated groups directly or indirectly on the surface of said substrate by a chemical absorption method or the Langmuir-Blodgett method, said method including a procedure of spreading a surfactant containing said electrolytically polymerizable unsaturated groups on the surface of a water bath to form a monomolecular film, transferring of said monomolecular film onto the surface of said substrate, and chemically bonding molecules of said surfactant to form said monomolecular film of said surfactant containing electroconductive conjugated groups, applying a voltage between said first electrode and said second electrode to polymerize said electrolytically polymerizable unsaturated groups, and deriving a third electrode from said substrate such that said substrate acts as said third electrode.

2. The process for producing an organic device according to claim 1, in which said step of forming said monomolecular or built-up multi-monomolecular film containing said electrolytically polymerizable groups includes a procedure of forming at least one layer of said monomolecular film by chemically adsorbing a silane surfactant containing said electrolytically polymerizable unsaturated groups from a non-aqueous organic solvent onto the surface of said substrate.

3. The process for producing an organic device according to claim 2, in which said silane surfactant is a chemical material containing a chlorosilyl group at a terminal.

4. The process for producing an organic device according to claim 1, in which after forming at least one layer of said monomolecular film containing said electrolytically polymerizable unsaturated groups on the surface of said substrate, said unsaturated groups are electrolytically polymerized by applying a voltage between said first electrode and said second electrode to produce electroconductive conjugated groups connecting between said first electrode and said second electrode.

* * * * *